(12) United States Patent
Klein

(10) Patent No.: US 6,295,709 B1
(45) Date of Patent: *Oct. 2, 2001

(54) PRINTED CIRCUIT BOARD ASSEMBLY AND METHOD FOR MAKING A PRINTED CIRCUIT BOARD ASSEMBLY

(75) Inventor: Dean A. Klein, Lake City, MN (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/914,625

(22) Filed: Aug. 19, 1997

Related U.S. Application Data

(62) Division of application No. 08/565,090, filed on Nov. 30, 1995.

(51) Int. Cl.[7] ............... B23P 19/04; B23P 6/00
(52) U.S. Cl. .......... 29/402.07; 29/423; 29/840; 228/177; 228/179.1; 228/215
(58) Field of Search ............... 29/840, 843, 857, 29/860, 402.07, 402.08; 228/177, 179.1, 119, 215, 180.2

(56) References Cited

U.S. PATENT DOCUMENTS

| 4,413,309 | 11/1983 | Takahashi et al. ............... 361/406 |
| 4,588,468 | * 5/1986 | McGinty et al. ............... 29/847 X |
| 5,048,747 | * 9/1991 | Clark et al. ............... 228/180.2 |
| 5,181,317 | * 1/1993 | Nishihara et al. ............... 29/840 X |
| 5,454,161 | * 10/1995 | Beilin et al. ............... 29/840 X |
| 5,615,387 | * 3/1997 | Crockett, Jr. et al. ............... 29/847 |
| 5,615,477 | * 4/1997 | Sweitzer ............... 29/840 |
| 5,650,595 | 7/1997 | Bentlage et al. ............... 174/260 |

* cited by examiner

Primary Examiner—Lee Young
Assistant Examiner—Rick Kiltae Chang
(74) Attorney, Agent, or Firm—Trop, Pruner & Hu, P.C.

(57) ABSTRACT

A PCB assembly which allows economical and reliable rework. The PCB assembly contains a soldermask and a trace with a portion of the trace exposed by a soldermask relief When one needs to rework the PCB assembly, one bonds a rework wire, using conventional intermetalic bonding materials, to the portion of the trace exposed by the soldermask relief There is no need to bond a rework wire to a component. Further, there is no need to scrape a off the soldermask and possibly damage the traces and/or vias. The bonds are high reliability bonds, and the labor required to perform such bonds are minimal.

8 Claims, 2 Drawing Sheets

PRINTED CIRCUIT BOARD ASSEMBLY AND METHOD FOR MAKING A PRINTED CIRCUIT BOARD ASSEMBLY

This Application is a Divisional of Ser. No. 08/565,090 filed Nov. 30, 1995.

BACKGROUND OF THE INVENTION

This invention relates in general to printed circuit boards ("PCBs"). More particularly this invention relates to a PCB assembly that can be economically and reliably reworked.

A person who designs and builds a PCB does not normally intend for the PCB to be reworked. PCBs often do need to be reworked, however. This need for reworking can be due to PCB layout errors, incorrect component selection, a change in design parameters, or any number of reasons. As is well known, reworking PCBs, especially PCBs with surface mount components, is difficult.

One conventional method to rework a PCB involves bonding rework wires to component leads. This task is labor intensive, especially with surface mount components. In addition, proper bonds between component leads and rework wires are difficult to achieve. Further, during the bonding process, the component may be damaged.

Another conventional method to rework a PCB involves scraping off the soldermask from PCB traces and/or PCB vias and attaching a rework wire to the exposed metal. In addition to being labor intensive, such methods often create surface imperfections in the exposed traces and/or vias. The surface imperfections, under certain environmental conditions such as shock, vibration, and/or temperature fluctuations, can fatigue and cause failures.

SUMMARY OF THE INVENTION

The invention relates to a PCB assembly which allows economical and reliable rework. The PCB assembly contains a soldermask and a trace with a portion of the trace exposed by a soldermask relief. When the PCB assembly requires rework, a rework wire is bonded, using conventional intermetalic bonding materials, to the portion of the trace exposed by the soldermask relief. There is no need to bond a rework wire to a component. Further, there is no need to scrape off the soldermask and possibly damage the traces and/or vias. The bonds are high reliability bonds, and the labor required to perform such bonds are mammal.

DETAILED DESCRIPTION OF SPECIFIC EMBODIMENTS

Figure 1:
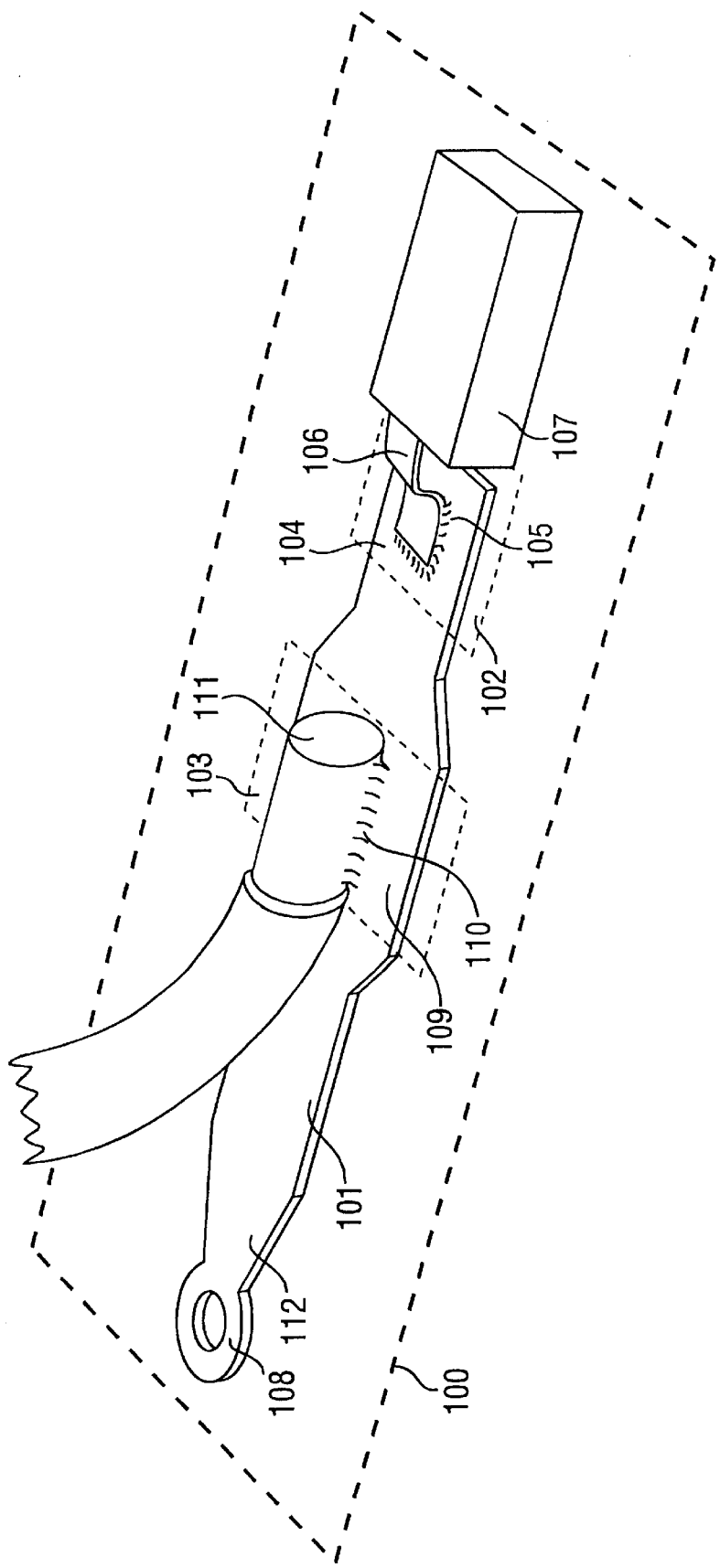
FIG. 1 is a three dimensional view of a PCB assembly that has been reworked.

Referring to FIG. 1, a PCB 100 contains at least one trace 101. The trate 101 is partially covered with a soldermask (not shown). However, portions 104 and 109 of the trace 101 are left exposed by reliefs 102 and 103 in the soldermask. A first portion 104 of the trace 101 is exposed by a first soldermask relief 102. The first soldermask relief 102 allows an intermetalic bond 105 between the first portion 104 of the trace 101 and a lead 106 of a component 107. The component 107 can be a surface mount component, a discrete component, a connector, or any other type of component conventionally used on PCBs. The bonding of the component 107 to the first portion 104 of the trace 101 is conventionally accomplished with the use of materials such as but not limited to solder, braze, weld material, and conductive epoxy. The trace 101 may connect the lead 106 of the component 107 to another component or to a power plane (not shown) through the use of a via 108. For the sake of clarity, only a single lead and a single trace are discussed. It should be understood that components have a plurality of leads, that PCBs have a plurality of trace 101s, and that the invention includes such embodiments.

Referring again to FIG. 1, a second portion 109 of the trace 101 is exposed by a second soldermask relief 103. The second soldermask relief 103 allows an intermetalic bond 110 between the second portion 109 of the trace 101 and a rework wire 111. This bond 110 is accomplished with the use of materials such as, but not limited to, solder, braze, weld material, and conductive epoxy.

Referring again to FIG. 1, one possible shape of the trace 101 is shown. As FIG. 1 shows, the width of the trace 101 varies along the length of the trace 101. The width of the second portion 109 of the trace 101 is increased from the width of the remaining portions of the trace 101 to facilitate manual bonding operations. This increase in width compensates for possible mismatching of the rework wire 111 with respect to the second portion 109 of the trace 101. In addition, FIG. 1 shows that the length of the second portion 109 of the trace 101 is greater than its width.

Figure 2:
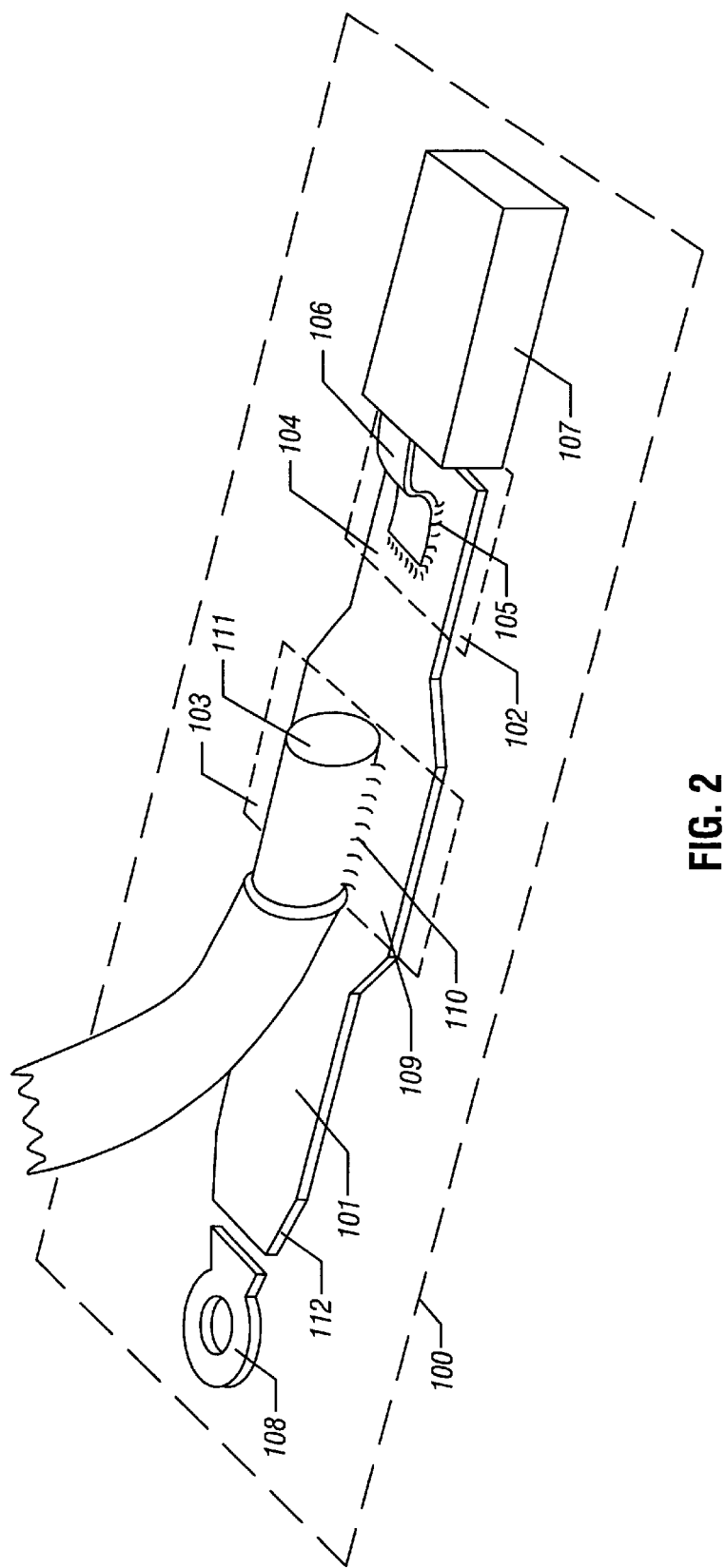
FIG. 2 illustrates the PCB assembly of FIG. 1 with a portion of a trace severed.

Again referring to FIG. 1, a third portion 112 of the trace 101 with a decreased width can be seen. When rework is performed, it is often necessary to sever a trace so that an electrical path can be redirected. This third portion 112 with a decreased width facilitates severing of the trace 101 if needed as shown in FIG. 2.

SOME ADVANTAGES OF THE INVENTION

An advantage of the invention is that it allows reworking of PCB. Many conventional PCBs are not reworkable. Thus, when a component becomes obsolete and no longer available, all PCBs in inventory must be scrapped. The invention allows reworking of PCBs that would otherwise be scrapped.

Another advantage of the invention is that it allows economical reworking of a PCB. Conventional methods of reworking PCBs are labor intensive. With the rising cost of labor, it is not economically feasible to rework many PCBs. The invention reduces the labor required to rework PCBs. Thus, rework becomes economically feasible.

Still another advantage of the invention is that it allows high reliability reworking. Conventional methods of reworking can damage components, traces and/or vias. This damage can result in failures over time. The invention allows reworking without damaging traces and vias because there is no need to scrape off a solder mask. Further, the invention allows reworking without damaging components because there is no need to solder a rework wire to a lead of a component.

Yet still another advantage of the invention is that it provides a low impedance rework path. By providing for a reliable bond of sufficient size, the impedance of the rework path can be minimized. A low impedance rework path is often critical when a trace connects a lead of a component to a power plane.

While the invention has been described in conjunction with specific embodiments thereof, it will be apparent to those of ordinary skill having the benefit of this disclosure that other modifications and changes therein in addition to the examples discussed above may be made by those skilled in the art without departing from the spirit and scope of the invention.

What is claimed is:

1. A method to rework a printed circuit board assembly, comprising:

exposing a portion of a device trace through a soldermask, the device trace having a first end electrically coupled to a first component and a second end;

attaching a first end of a rework wire to the exposed portion substantially between the first and second ends; and breaking an electrical continuity of the device trace in a region between the attached rework wire and the second end, wherein the device trace has a first width associated with the exposed portion and a second width associated with a second portion, the second portion being between the second end and the exposed portion, wherein the second width is narrower than the first width, and wherein the act of breaking the trace comprises severing the second portion of the trace.

2. The method of claim 1, wherein the act of attaching the first end of the rework wire comprises an act of soldering, brazing, welding or applying a conductive epoxy.

3. The method of claim 1, further comprising exposing the first end of the device trace.

4. The method of claim 1, wherein attaching the first end of the rework wire to the exposed portion comprises bonding the rework wire first end directly to the device trace.

5. The method of claim 1, wherein the trace is continuously provided between the first and second ends, and wherein attaching the first end of the rework wire comprises attaching the first end of the rework wire to the exposed portion of the continuously provided trace.

6. A method for use with a printed circuit board, comprising:

exposing a portion of a trace having two ends, the trace having a length and a width that varies along the length;

connecting a rework wire to the exposed portion of the trace; and breaking a continuity of the trace in a region having a reduced width as compared to another region of the trace, wherein exposing the portion comprises exposing a portion having a width greater than the width of the region being broken.

7. The method of claim 6, further comprising exposing another portion of the trace proximal one of the ends.

8. The method of claim 6, wherein connecting the rework wire comprises connecting the rework wire to the exposed portion of the trace.

* * * * *